United States Patent
Richter

Patent Number: 5,872,728
Date of Patent: Feb. 16, 1999

[54] PROCESS FOR COMPUTING THE COEFFICIENTS OF AN ADAPTIVE FILTER IN AN ECHO-CANCELLOR

[75] Inventor: Gerard Richter, Saint Jeannet, France

[73] Assignee: International Business Machines Corporation, Armonk, N.Y.

[21] Appl. No.: 831,271

[22] Filed: Mar. 31, 1997

[30] Foreign Application Priority Data

Jun. 20, 1996 [EP] European Pat. Off. ............. 96480085

[51] Int. Cl.$^6$ ............................................ G06F 17/10
[52] U.S. Cl. ..................................... 364/724.2; 455/307
[58] Field of Search ........................ 364/724.2, 724.12; 455/307, 506

[56] References Cited

U.S. PATENT DOCUMENTS

| | | | |
|---|---|---|---|
| 4,789,994 | 12/1988 | Randall | 364/724.2 |
| 5,390,364 | 2/1995 | Webster et al. | 455/307 |
| 5,615,233 | 3/1997 | Baum et al. | 364/724.2 |

Primary Examiner—David H. Malzahn
Attorney, Agent, or Firm—Gerald R. Woods

[57] ABSTRACT

A process for computing the coefficients C(i) of an adaptive filter (206) used in an echo-cancellation structure for a telecommunication apparatus. The process is based on the Least Mean Squared (L.M.S.) or gradient algorithm for computing the coefficients of the filter in accordance with the formula:

$$C_i(n+1) = C_i(n) - \alpha \frac{\partial e(n+1)}{\partial C_i(n)} \times e(n+1)$$

where e(i) is the estimation error and $\alpha$ is the step size used for performing an adjustement of the convergence of the filtering process. The process uses two different estimations of the power of the analog signal, a former short-term estimation and a latter long-term estimation in order to derive the appropriate value of the stepsize $\alpha$ which is used for computing the new coefficients. In the preferred embodiment the value of $\alpha$ is determined by dividing a constant $\alpha_0$ being slightly lower than the maximum value ensuring stability of the convergence process by the greater of the two different estimations of the power of the analog signals.

5 Claims, 4 Drawing Sheets

PROCESS FOR COMPUTING THE COEFFICIENTS OF AN ADAPTIVE FILTER IN AN ECHO-CANCELLOR

TECHNICAL FIELD OF THE INVENTION

The invention relates to the telecommunication field and more particularly to a process for adaptive filtering that is applied to voice signals in an echo-cancellor.

BACKGROUND ART

Digital adaptive filtering is widely used in the telecommunication field, particularly for designing equalizers and echo cancellors in modems. A well known technique for achieving adaptive filtering is known as the Least Mean Square (L.M.S.) adaptation process that is also referred to as the "Gradient" method which proved its efficiency and simpleness.

The LMS adaptive filtering process is based on the use of coefficients which are computed in accordance with the following formula:

$$C_i(n+1) = C_i(n) - \alpha \frac{\partial e(n+1)}{\partial C_i(n)} \times e(n+1)$$

where e(n) is the estimation error.

The step size $\alpha$ is used for performing an adjustment of the convergence of the filtering process. Prior art document "Analyse des signaux et filtrage numérique adaptatif" by M. Bellanger, Ed. Masson, 1989, teaches that the value of the step size $\alpha$ should be computed in accordance with the formula:

$$\alpha = \frac{\alpha_0}{\sigma^2_x}$$

where $\delta^2_x$ represents the power of the input signal that is being processed, and $\alpha_0$ represends a constant.

The skilled man is generally aware that he has to choose the value of $\alpha_0$ in a range $|0, \alpha_s|$ where $\alpha_s$ represents the instability threshold of the system. It can be shown that is $\alpha_0$ is chosen great (but still inferior to $\alpha_s$), the convergence speed is high but also with a non satisfactory high residual error. On the contrary, should $\alpha_0$ be chosen lower, the residual error is rendered lower, but at a cost of a lower convergence speed.

FIGS. 1a and 1b are respectively a one-dimension and two-dimensions graphical representations of the gradient method. More particularly, FIG. 1a shows the representation of the means error $e^2$ (n) as a function of a single filter coefficient C1. FIG. 1b illustrates the two-dimensional parabolic figure of the mean error $e^2$ (n) as a function of the two coefficents C1 and C2 characterizing a two-coefficient filter. As shown in FIG. 1b, it appears that from an initial setting $$\vec{C}_{(0)} \begin{vmatrix} C_{1(0)} \\ C_{2(0)} \end{vmatrix},$$

there is a convergence process that makes the vector $\vec{C}_{(n)}$ reaching the optimum $\vec{C}_{opt}$ which coordinates are C1opt and C2opt. In the theorical representation of FIG. 1b, that any value of $\alpha_0$ being inferior to $\alpha_s$ ensures the convergence process of $\vec{C}_{(n)}$ towards the optimal vector $\vec{C}_{opt}$. However, it should be noticed that this theorical representation is quite satisfactory when the signal being processed has the characteristics of white noise, and appears uncorrelated and stationnary.

However, the real situation is somewhat quite different when voice signals are to be processed by the LSM method. On the contrary to white noise, speech signals are correlated and present local stationarity. The problem of designing equalizers for processing voice signal is addressed in prior art document "Second-order Convergence Analysis of Stochastic Adaptive linear filtering" by Odile Macchi et al, IEEE Trans. on Automatic Control, vol. AC-28, n° 1, January 83; and, from the same author in document "Convergence Analysis of self-Adaptive Equalizers", IEEE trans. on Information Theory, vol. IT-30, n 2, March 84. Basically, the real situations differ from the theorical and ideal model of FIG. 1b in the existence of some local maxima, that are different from the optimum vector $\vec{C}_{opt}$, and which are likely to disturb the gradient convergence mechanism.

Such real situations are illustrated in FIG. 1c which shows that the residual error might strongly depend on the particular setting conditions $$\vec{C}_{(0)} \begin{vmatrix} C_{1(0)} \\ C_{2(0)} \end{vmatrix}$$

as well as the value of $\alpha_0$ that is chosen. It was mentioned above, that it was possible to reach the optimum $\vec{C}_{opt}$ in the theoretical model with a low value of the residual error. However, in real situations, it appears that a low value of $\alpha_0$ might in certain circonstances not ensure the convergence towards the optimum vector $\vec{C}_{opt}$ because of the existence of the disturbing local optima such as shown in FIG. 1c. Should the filtering mechanism converge towards a local minimum instead of the optimum value, this will result in unsatisfactory value of the residual error. To improve the situation, it is necessary to increase the value of $\alpha_0$, thus facilitating the process to diverge from the local maxima which are not the optimum point. However, as mentioned above, the increase of $\alpha_0$ also causes an increase of the residual error.

Additional difficulties are encountered from the increase of the value of $\alpha_0$ when processing voice or other non stationary signals in equalizers that are used in the telecommunication field. Indeed, in such signals the actual value of the power $\delta^2_x$ is subject to large fluctuations that actually depend on the vocal message being processed. For instance, vocal signals may exhibit strong and sudden increase in the power of the signal. These strong variations might occur more rapidly relatively to the normal processing of the signal. It should be noticed that the echo cancellors that are generally used in the telecommunication field are based on digital filters that process the signals over 32 or 64 milliseconds, that is to say the samples which are used for filtering process generally exceeds 32 or 64 milliseconds. This set of samples are in a range that extends over 32 or 64 milliseconds, is also used for computing an estimation of the power $\delta^2_x$. Voice signals that are transmitted on telecommunication lines present the characteristics of requiring filtering process that uses samples that extend over 32 or 64 milliseconds, while the characteristics of speech signals might cause sudden variations—less than 10 milliseconds—in the power of the signal being processed. It therefore results in the fact that in equalizers used in the telecommunication field, the estimated value of $\delta^2_x$ might be too low with respect to the actual and instantaneous power of the signal. This inevitably spoils the $\alpha$ determination process which is based on the previously mentioned formula:

$$\alpha = \frac{\alpha_0}{\sigma^2_x}$$

Indeed, if $\delta^2_x$ is estimated far lower than the actual power of the signal, the value of $\alpha$ being computed might exceed the value of $\alpha_s$ being mentioned above, thus resulting in a divergence of the coefficients determination.

As a result, it appears that voice signals are not easily processed by traditional equalizers which are used in the telecommunication field. In both cases, the choice of small and large values of $\alpha_0$ might not ensure the convergence process of the coefficient determination because of the particular characteristics of the speech signals.

SUMMARY OF THE INVENTION

The problem to be solved by the present invention is to provide a process that is adapted to voice signals and ensures the convergence of the process of determination of the filtering coefficient.

It is an object of the present invention to provide a echo-cancellor that is based on the LMS method and which is still adapted for processing speech signals.

This problem is solved by a process for computing the coefficients C(i) of an adaptive filter. The process, based on the least Mean Squared (L.M.S.) or gradient algorithm, computes the coefficients of the filter by using a step size $\alpha$ in the formula $$C_i(n+1) = C_i(n) - \alpha \frac{\partial C_i(n+1)}{\partial e(n+1)} \times e(n+1)$$

and uses two different estimations of the power of the analog signal: a former short-term estimation characterized by a integration constant of a few milliseconds and a latter long-term estimation of more than 30 milliseconds. In the preferred embodiment of the invention, the step size is computed by dividing a constant $\alpha_0$ being slightly lower than the maximum value that still allows stability of the convergence process, by the greater of the two different estimations of the power of the analog signal. The process takes advantage of the long-term estimation of the power that is already used in the filtering process of the echo cancellor.

In a preferred embodiment of the invention, the process involves the steps of:
  processing the samples X(n) derived from the analog signal being transmitted by said telecommunication apparatus in order to produce an estimation $\tilde{y}_{(n)}$ of the echo in accordance with the formula:

$$\tilde{y}_{(n)} = \sum_i C_i x_{n-i}$$

computing an estimation of the error e(n) in accordance with the formula:

$$e = y - \tilde{y}$$

where y(k) represents the real value of the analog signal that is received by said telecommunication apparatus;

computing a first short-term estimation $\Sigma_s$ of the signal power in accordance with the formula:

$$\Sigma_s(n+1) = (1-\mu)\Sigma_s(n) + \mu x^2(n)$$

with $\mu$ being a first integration constant,
  computing a second long-term estimation $\Sigma$ of the signal power in accordance with the formula:

$$\Sigma_l(n+1) = (1-\gamma)\Sigma_l(n) + \gamma x^2(n)$$

where $\gamma^0$ represents an integration constant that is fixed to a value that is lower than said first integration constant $\mu$;
  computing a value of a parameter $\alpha$ in accordance with the formula:

$$\alpha = \frac{\alpha_0}{max(\Sigma_s, \Sigma_l)}$$

where Max represents the higher value of both said first and said second estimation of said signal power,
  updating the filter coefficients with the use of the value of $\alpha$ computed in the preceding step in accordance with the formula:

$$C_i(n+1) = C_i(n) - \alpha e\ (n+1)x(n+i+1)$$

The invention also provides with an echo-cancellor that is well suited for processing speech signals.

DESCRIPTION OF THE PREFERRED EMBODIMENT OF THE INVENTION

Figure 1A:
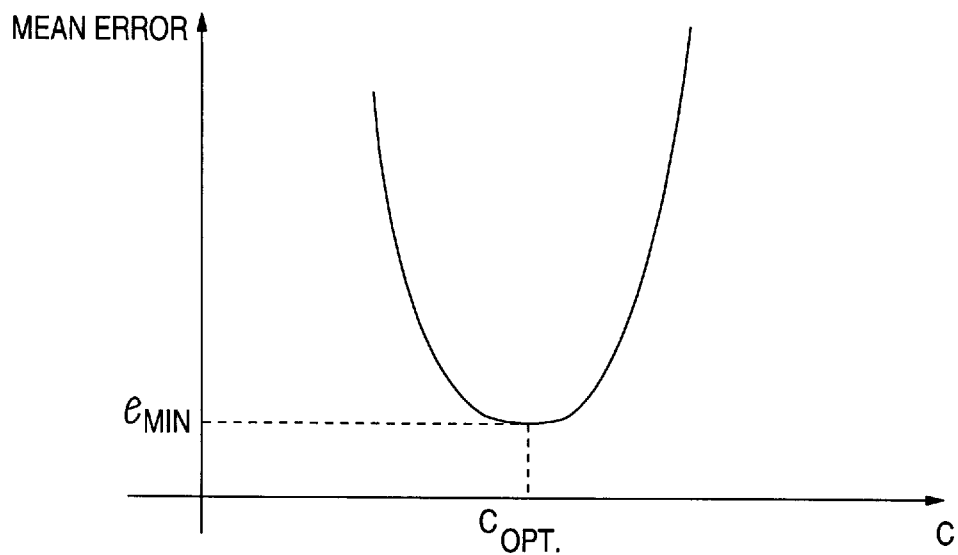
FIGS. 1a, 1b and 1c are graphical representations of the LMS adaptive filtering process.
Figure 1B:
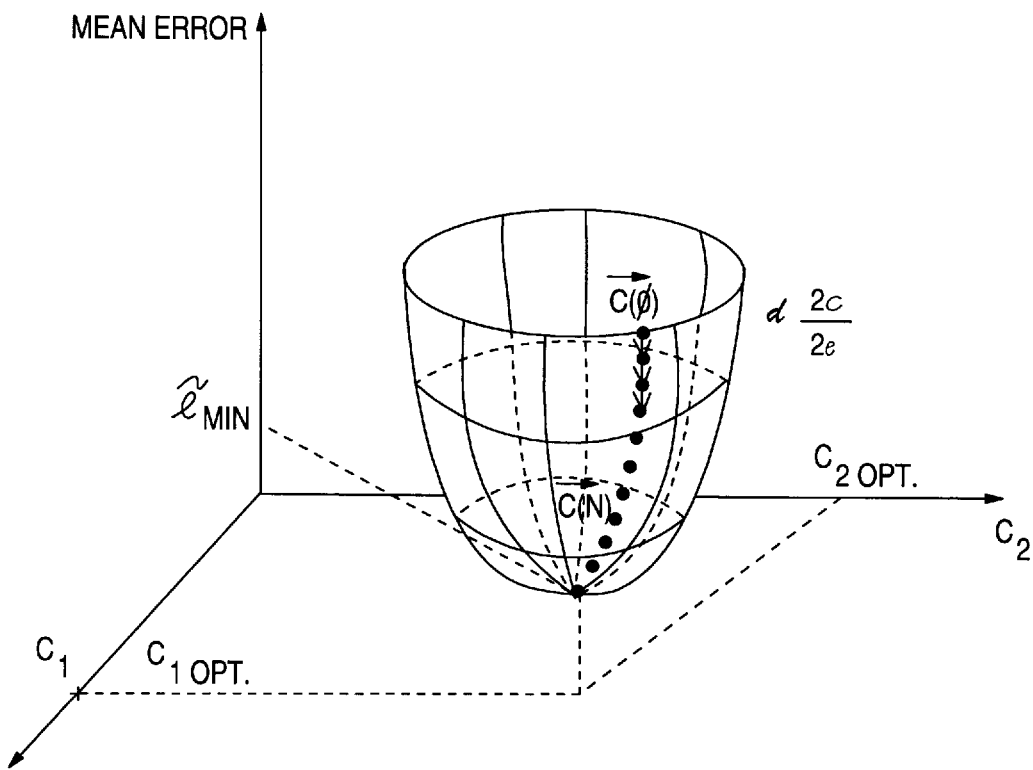
Figure 1C:
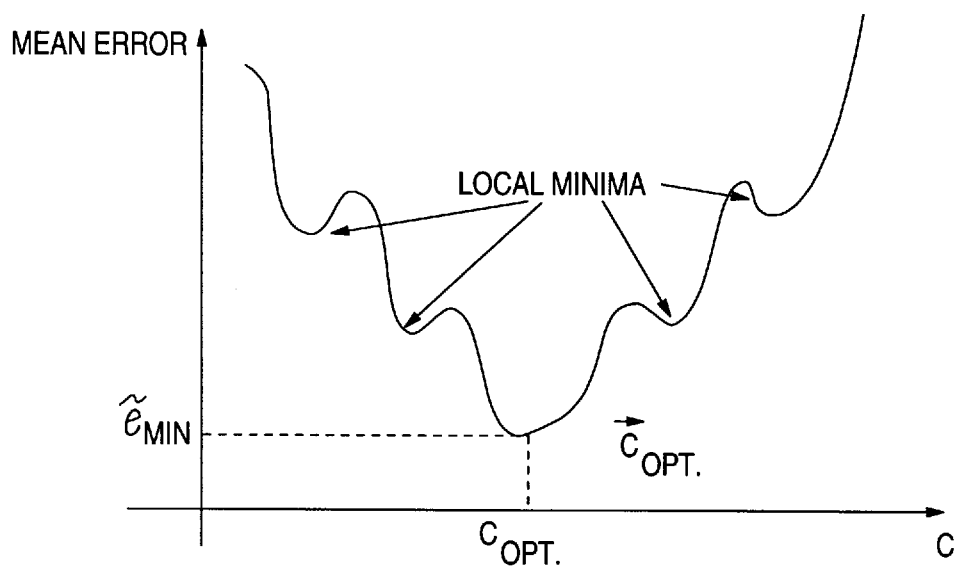
Figure 2:
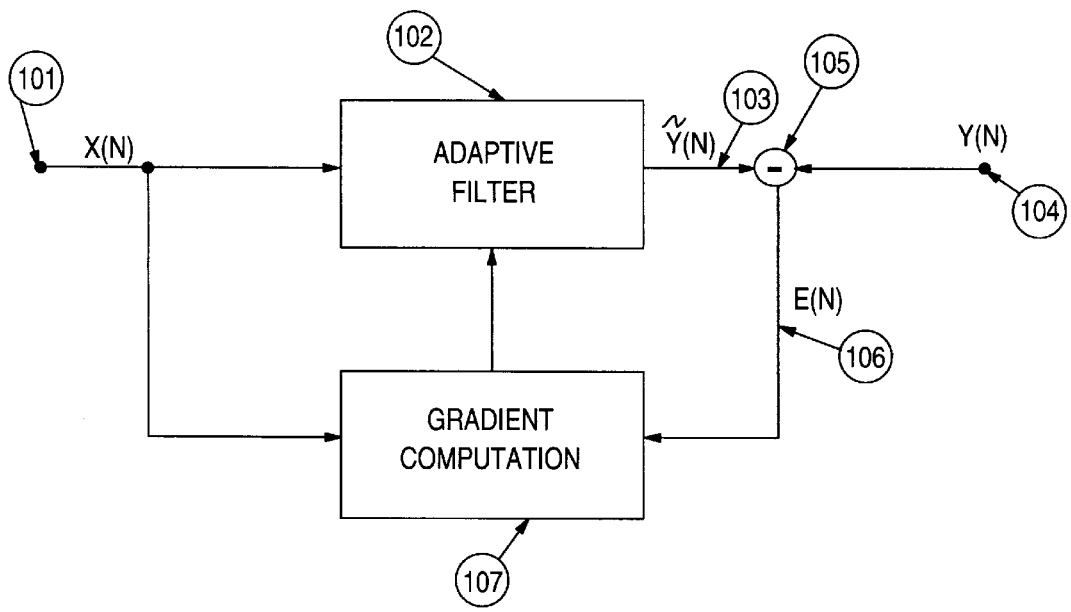
FIG. 2 illustrates the general structure of an adaptive filter that uses the gradient method.

FIG. 2 shows the general structure of an adaptive filter that comprises a filter 102 that computes $\tilde{y}(n)$ in accordance with the formula $$\tilde{y}_{(n)} = \sum_i C_i x_{n-i}$$

The structure also comprises a substractor 105 that is used for determining the estimation error e(n) between the estimated filtered value $\tilde{y}(n)$ and the real value y(n). A gradient computation element uses the estimated error for continuously determining the coefficients C(i) that are to be used in the adaptive filter 102.

Figure 3:
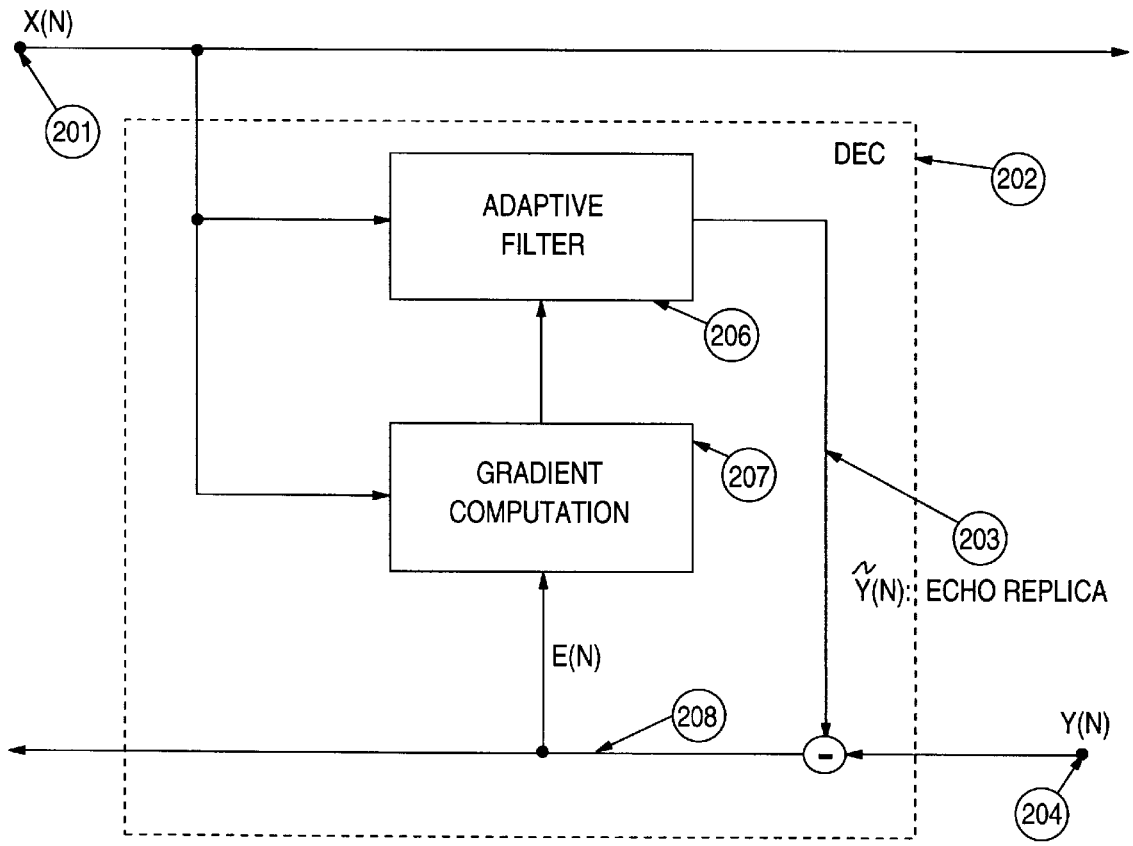
FIG. 3 shows the adaptation of the structure to provide an echo cancellor in a telecommunication equipment.

FIG. 3 shows the adaptation of the structure in order to provide an echo cancellor that is intended for a telecommunication product. The structure is based on an adaptive filter 206 that computes the echo replica 203 which is substracted from the incoming signal on lead 204 in order to cancel the echo. The cancellation error on lead 208 is used by the gradient computation element 207 in order to continuously update the coefficients which are used by adaptive filter 206. This processing is continuously performed for each new sample x(n) being derived from the analog signal being transmitted to the telecommunication line.

Figure 4:
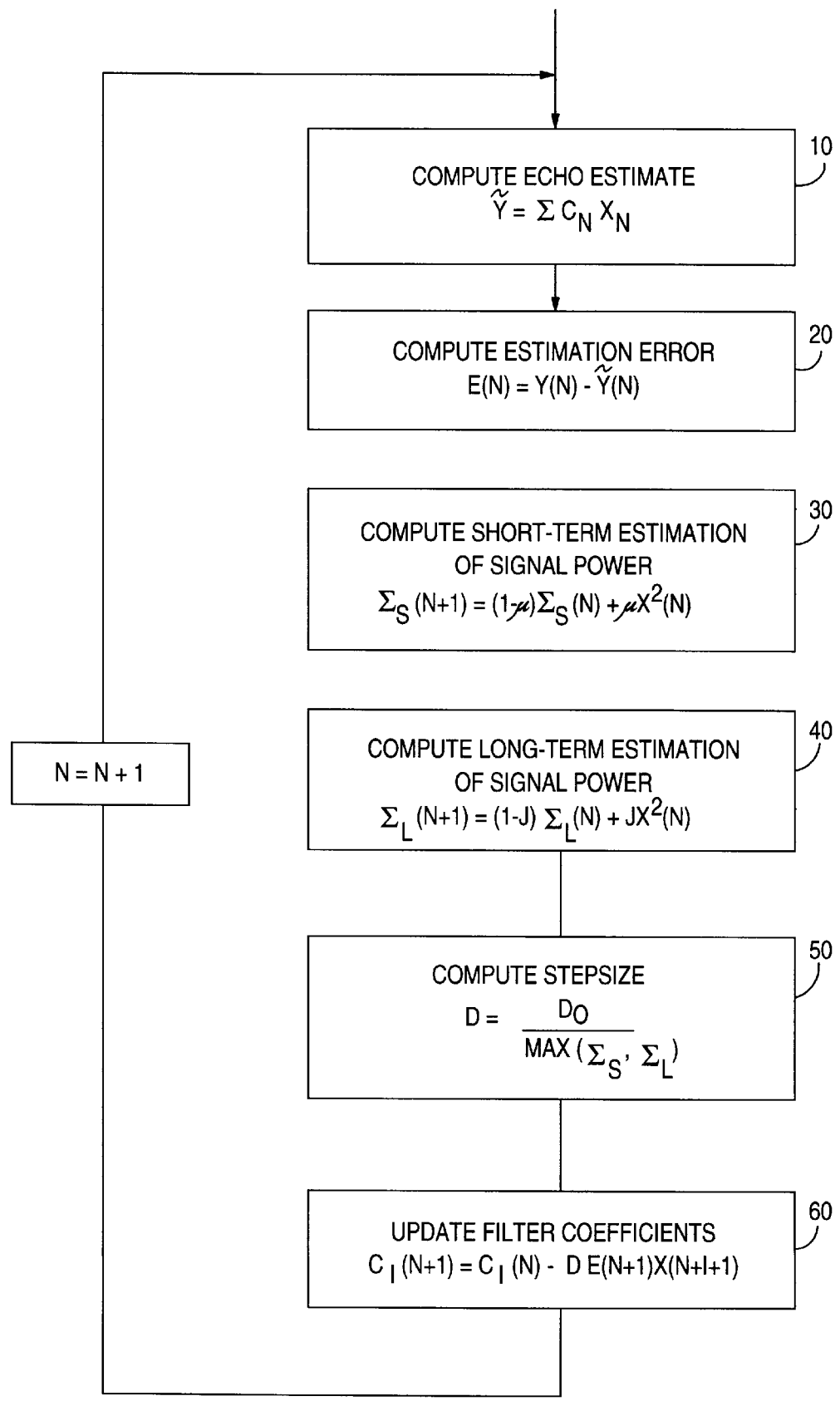
FIG. 4 illustrates the process of echo cancellation in the present invention.

FIG. 4 illustrates the process of echo cancellation in accordance with the present invention. The process begins with step 10 where the samples X(n) are processed in order to derive an estimation of the echo in accordance with the following formula:

$$\tilde{y}_{(n)} = \sum_i C_i x_{n-i}$$

Then, step 20, an estimation of the error e(n) is computed in accordance with the formula:

$$e = y - \tilde{y}$$

In step 30, a first computation is performed in order to derive the short-term estimation of the signal power in accordance with the formula:

$$\Sigma_s(n+1) = (1-\mu)\Sigma_s(n) + \mu x^2(n)$$

with $\mu$ being an integration constant that is fixed to a value that corresponds to a value of several milliseconds. In the preferred embodiment of the invention, the constant $\mu$ is chosen to fix the integration period of the computation of the signal power to be equal to about 2 milliseconds.

Next, step 40, a similar computation is performed with a different integration constant $\gamma$ that causes the power to be estimated during the traditional long-term period which corresponds to the requirements of the filtering process and the capabilities of cancelling echoes about 30 or more milliseconds.

$$\Sigma_1(n+1) = (1-\gamma)\Sigma_1(n) + \gamma x^2(n)$$

In the preferred embodiment of the invention, the second gamma parameter is fixed to cause the estimation to be performed over a period of about 32 milliseconds.

In step 50, the value of parameter $\alpha$ is computed in accordance with the formula:

$$\alpha = \frac{\alpha_0}{max(\Sigma_s, \Sigma_l)}$$

Therefore it appears that both the values of the short-term and long-term estimated signal power are used for the computation of the step size of the convergence process.

In step 60, the step size coefficient $\alpha$ is used for the update of the coefficients C(n) in accordance with the gradient method:

$$C_i(n+1) = C_i(n) - \alpha e(n+1) x(n+1=1)$$

Then the process proceeds with the processing of the next sample X(n+1) which is determined from the received analog signal, and the algorithm returns back to step 10.

Therefore it appears that the updating computation of the coefficients is made by using an estimation of both a short-term power for taking into account the characteristics of correlation of speech and long-term power that is used in telecommunication echo-cancelling algorithms. This ensures an optimal convergence of the gradient algorithm in most real situations.

I claim:

1. For use in an echo-cancellor structure for a telecommunication apparatus, a process for adjusting the coefficients of an adaptive filter in said echo-cancellor structure comprising the steps of:

computing a first estimation of the power of the analog signal being processed over a first period of time;

computing a second estimation of the power of the analog signal being processed over a second period of time, said second period of time being longer than said first period;

computing a convergence step size $\alpha$ as an inverse function of the greater of the first and second power estimations; and adjusting the coefficients C of the adaptive filter in accordance with the formula $$C_i(n+1) = C_i(n) - \alpha \frac{\partial e(n+1)}{\partial C_i(n)} \times e(n+1)$$

where e is the estimation error, n and n+1 are sampling intervals and $\partial$ is a partial derivative symbol.

2. A process according to claim 1 wherein an initial value of $\alpha$ is fixed at a value slightly lower than the level of instability of the convergence process.

3. For use in an echo-cancellor structure for a telecommunication apparatus, a process for adjusting the coefficients of an adaptive filter in said echo-cancellor structure comprising the steps of:

processing sample X(n) derived from the analog signal in order to produce an estimation $$\tilde{y}_{(n)} = \sum_n C_n x_n$$

y of the echo in accordance with the formula computing an estimation of an error signal e(n) in accordance with the formula $$e = y - \tilde{y}$$

where y represents the real value of the analog signal;

computing a first short-term estimation $\Sigma_s$ of the signal power in accordance with the formula $$\Sigma_s(n+1) = (1-\mu)\Sigma_s(n) + \mu x^2(n)$$

where $\mu$ is a first integration constant;

computing a second longer-term estimation $\Sigma_1$ of the signal power in accordance with the formula $$\Sigma_1(n+1) = (1-\gamma)\Sigma_1(n) + \gamma x^2(n)$$

where $\gamma$ represents an integration constant fixed at a value lower than first integration constant $\mu$;

computing a parameter $\alpha$ in accordance with the formula $$\alpha = \frac{\alpha_0}{max(\Sigma_s, \Sigma_i)}$$

and adjusting the coefficients of the filter in accordance with a formula $$C_1(n+1) = C_i(n) - \alpha e(n+1) x(n+i+1).$$

4. A process according to claim 3 characterized in that said first integration constant is approximatively fixed to be equal to 2 milliseconds.

5. A process according to claim 4 characterized in that said second integration constant is fixed to a value that is higher than 30 milliseconds.

* * * * *